US009453906B2

United States Patent
Floyd et al.

(10) Patent No.: US 9,453,906 B2
(45) Date of Patent: Sep. 27, 2016

(54) PHASE CALIBRATION CIRCUIT AND METHOD FOR MULTI-CHANNEL RADAR RECEIVER

(71) Applicants: North Carolina State University, Raleigh, NC (US); Asahi Kasei Microdevices Corporation, Chiyoda-ku, Tokyo (JP)

(72) Inventors: Brian Floyd, Raleigh, NC (US); Takeji Fujibayashi, Kanagawa (JP); Seiji Takeuchi, Kanagawa (JP)

(73) Assignees: North Carolina State University, Raleigh, NC (US); Asahi Kasei Microdevices Corporation, Tokyo (JP)

( * ) Notice: Subject to any disclaimer, the term of this patent is extended or adjusted under 35 U.S.C. 154(b) by 310 days.

(21) Appl. No.: 14/447,702

(22) Filed: Jul. 31, 2014

(65) Prior Publication Data
US 2016/0033625 A1   Feb. 4, 2016

(51) Int. Cl.
*G01S 7/40*   (2006.01)
*H03L 7/089*   (2006.01)
*H03K 5/003*   (2006.01)
*G01S 13/34*   (2006.01)

(52) U.S. Cl.
CPC .......... *G01S 7/4021* (2013.01); *G01S 13/343* (2013.01); *H03K 5/003* (2013.01); *H03L 7/089* (2013.01)

(58) Field of Classification Search
CPC ... G01S 7/4021; G01S 13/343; H03K 5/003; H03L 7/089
USPC .............................. 342/174, 175, 5, 103, 195
See application file for complete search history.

(56) References Cited

U.S. PATENT DOCUMENTS

| 4,506,264 | A | * | 3/1985 | Bogert | G01S 7/38 342/103 |
| 5,150,128 | A | * | 9/1992 | Kongelbeck | G01R 25/00 342/102 |
| 5,412,325 | A | * | 5/1995 | Meyers | G01R 29/26 324/613 |
| 5,614,855 | A | | 3/1997 | Lee et al. | |
| 5,682,165 | A | * | 10/1997 | Lewis | H01Q 21/0025 342/174 |
| 5,739,727 | A | * | 4/1998 | Lofter | H03L 7/0805 331/11 |

(Continued)

OTHER PUBLICATIONS

L. Cheng, C. X. Chen, F. Ye, N. Li and J. Y. Ren, "A digitally calibrated current-steering DAC with current-splitting array," 2012 IEEE 55th International Midwest Symposium on Circuits and Systems (MWSCAS), Boise, ID, 2012, pp. 278-281.*

*Primary Examiner* — John B Sotomayor
(74) *Attorney, Agent, or Firm* — Maine Cernota & Rardin

(57) ABSTRACT

This invention describes circuits and methods which can allow multiple radar receiver chips to be adjusted to have very low phase offset between them. Multiple receiver chips are used in frequency-modulated carrier-wave (FMCW) radar systems for beamforming to enable angle-of-arrival measurements. FMCW radar systems are widely used in collision-avoidance and adaptive cruise control systems in vehicles, which today are operating in the 76-81 GHz frequency band. In a multi-receiver system, each receive element must have a well-controlled phase response which can be calibrated over process, voltage, and temperature. Without calibration, phase offsets can result in erroneous beamforming receiver measurements. The inventive circuit provides a technique to adjust the phase of multiple receivers across multiple chips using a single local oscillator reference and built-in-test circuitry which consist of phase shifters, a multi-frequency nonlinear phase detection circuit, and power coupling circuits.

20 Claims, 18 Drawing Sheets

PHASE CALIBRATION METHOD FOR MULTI-CHANNEL RADAR RECEIVER

(56) References Cited

U.S. PATENT DOCUMENTS

| | | | | |
|---|---|---|---|---|
| 2005/0156634 A1* | 7/2005 | Coleman | ................ | H03L 7/06 327/16 |
| 2005/0156781 A1* | 7/2005 | Coleman | ................ | G01S 7/282 342/174 |
| 2009/0109085 A1* | 4/2009 | Needham | ................ | G01S 7/4017 342/174 |
| 2015/0084808 A1* | 3/2015 | Vacanti | ................ | G01S 7/41 342/122 |
| 2016/0033625 A1* | 2/2016 | Floyd | ................ | G01S 7/4021 342/174 |

* cited by examiner

100

200

300

400

600

700

800

FREQUENCY MULTIPLIER

900

FREQUENCY DIVIDER

1000

1100

1305 LOCAL OSCILLATOR PATHS

PHASE ADJUST PLL

1400

1500

PHASE ADJUST PLL: PHASE DETECTOR

PHASE ADJUST PLL: LATCH (HOLD) MODE

PHASE SHIFTER

PHASE CALIBRATION METHOD FOR MULTI-CHANNEL RADAR RECEIVER

PHASE CALIBRATION CIRCUIT AND METHOD FOR MULTI-CHANNEL RADAR RECEIVER

FIELD OF THE INVENTION

The invention relates to a circuit and method which allows multiple radar receiver chips to be adjusted to have very low phase offset between them.

BACKGROUND OF THE INVENTION

Frequency-modulated continuous-wave (FMCW) radar systems are widely used in collision-avoidance and adaptive cruise control systems in vehicles, which today are operating in the 76-81 GHz frequency band. In a multi-receiver system, each receive element must have a well-controlled phase response which can be calibrated over process, voltage, and temperature. Multiple receiving antennas each attached to a receiver circuit are used to provide a beamforming capability. Signals coming from a particular direction will arrive at each receiving antenna with a specific delay with respect to one another. This delay depends upon the angle of arrival of the incoming signal as well as the locations of each receiving antenna. Since the antenna locations are known, the process of determining the angle of arrival of the received radar signal is related to accurately measuring the delay of the signals among the multiple receiving elements. Furthermore, the delay can be represented as a phase shift for narrowband signals and small antenna separations. As a result, accurate determination of the phase response of each receiving element is required to accurately measure angle of arrival for the received signals. Without calibration, phase offsets can result in erroneous beamforming receiver measurements.

What is needed is a technique to adjust the phase of multiple receivers across multiple chips using a single local oscillator reference and built-in-test circuitry.

SUMMARY OF THE INVENTION

An embodiment provides a phase calibration circuit device comprising a first signal splitter receiving a local oscillator (LO) input signal, and outputting an output A and an output B; a first signal adjustment circuit comprising a first phase shifter, wherein the first signal adjustment circuit comprises a phase control signal port, a signal adjustment input signal port, and a signal adjustment output signal port; a second signal splitter receiving a first signal adjustment output signal from the first phase shifter, the second signal splitter comprising a LO output and an output C; a phase detection circuit receiving the output signal B from the first signal splitter and the output signal C from the second signal splitter, the phase detection circuit comprising a phase detection circuit output signal that is related to a phase difference between the signal B and the signal C; and converging in the negative feedback loop whereby phase offset is reduced. In embodiments a first amplifier circuit receives the output signal A from the first signal splitter. In other embodiments a filter receives the phase difference signal from the phase detection circuit, the filter outputting a filtered signal to the phase control signal port in the first phase shifting circuit, wherein the filter function is realized as an ADC/DAC combination and digital function to provide the filtering operation. In subsequent embodiments the first signal adjustment circuit includes a frequency multiplier wherein a frequency of an output signal of the first signal adjustment circuit is a multiple of a frequency of the input signal to the signal adjustment circuit and wherein the frequency multiplier can be placed either before or after the first phase shifter. For additional embodiments the signal adjustment circuit includes a frequency divider wherein a frequency of the input signal is a multiple of a frequency of an output signal to the signal adjustment circuit and wherein a frequency divider can be placed either before or after the phase shifter.

Another embodiment provides a phase detection circuit comprising a first adder for receiving a signal A and a signal B, wherein one of the Signal A and the Signal B has a frequency which is a multiple of the other the signal; and a first distortion circuit that has a third order or higher odd-order distortion, the first distortion circuit receiving a first adder output signal from an output of a first adder, the first distortion circuit outputting a DC signal generated by the third or higher odd-order distortion and also related to a phase relationship between signal A and signal B. In yet further embodiments the first adder comprises a directional coupler comprising a first Signal A or first Signal B input; a second Signal B or Signal A input, an added signal output; a Signal A or Signal B output. In related embodiments the first adder comprises a transformer comprising a Signal A input; a Signal B input; and an added differential or single-end output signal. For further embodiments the first adder comprises a Signal A input; a Signal B input; an output; and a resistive divider network between the Signal A input, Signal B input and output signal. In ensuing embodiments a phase detector comprises a differential Signal A input; a differential Signal B input, wherein the inputs are combined and presented to a differential amplifier or a buffer with third and/or fifth order distortion, the differential amplifier or buffer outputting a DC signal that contains phase information, wherein a frequency of the differential Signal A is a multiple of the frequency of the differential Signal B. Continued embodiments comprise a differential input circuit; the differential input circuit comprising DC offset correction; and a differential amplifier or buffer creating third order or odd order distortion higher than three; wherein the DC offset correction of the differential input circuit provides input to the differential amplifier or buffer to eliminate an offset of the DC offset of the differential amplifier or buffer.

A yet further embodiment provides a phase calibration method for adjusting a plurality of frequency-modulated carrier-wave (FMCW) radar receiver chips to have reduced phase offset comprising providing a circuit comprising a single local oscillator reference and built-in-test circuitry; the built-in-test circuitry comprising phase shifters, a multi-frequency nonlinear phase detection circuit, and power coupling circuits; splitting a signal in a first splitter; adjusting an output from the splitter in a first phase shifter; splitting output from a first amplifier circuit in a second splitter; adding a signal A and a signal B in a first adder; applying outputs of the first adder to a phase detection circuit; integrating phase difference signal from the phase detection circuit; outputting the integrated signal to the first amplifier; converging in negative feedback loop whereby phase offset is reduced.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
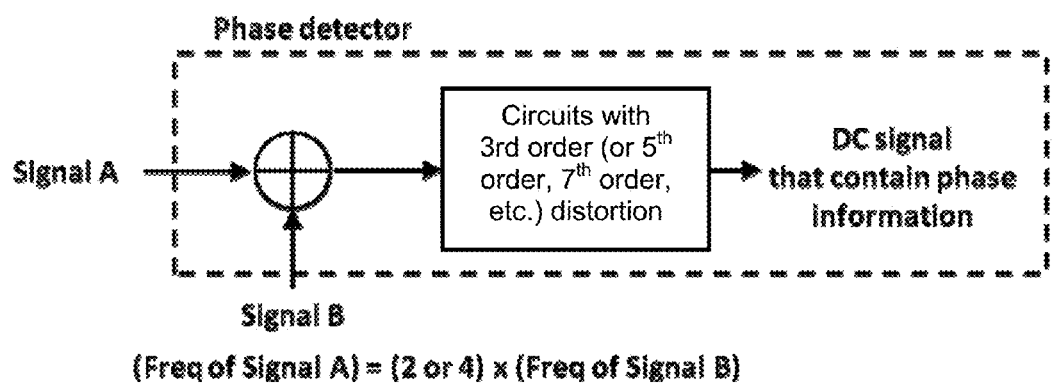
FIG. 1 is a diagram for a phase detection circuit configured in accordance with one embodiment of the present invention.

FIG. 1 shows a phase detection circuit comprising: a first adder or combiner circuit which combines Signal A and Signal B, wherein the frequency of Signal A is an even multiple of the frequency of Signal B; and a first "distortion" circuit that creates odd-order distortion, i.e., third order, fifth order, etc. owing to the nonlinear interaction between the combined signals from the first adder. The output of the distortion circuit is a DC signal that is generated by the third or higher odd order distortion circuit and also related to the phase relationship between Signal A and signal B.

In practice, Signal A can be represented as $A\sin(\omega t)$, and Signal B can be represented as $B\sin(2\omega+\text{theta})$, where A and B are the amplitudes of signals A and B, respectively, $\omega$ is the angular frequency, and theta is the multiplied phase offset between the two signals. A distortion circuit having third-order distortion has a transfer function which can be represented by a power series as follows: $a_1 x + a_3 x^3$, where $a_1$ represents the linear response of the circuit and $a_3$ represents the third-order distortion. Under these conditions, the DC output can be shown to be approximately $-\frac{3}{4} a_3 A^2 B \sin(\text{theta})$.

It should be understood that this example is one of many possible configurations where odd-order distortion can be used together with input signals having even multiples of frequency to produce a DC output proportional to the phase offset between the two original signals. One skilled in the art will realize that higher-order distortion can be used together with higher frequency multiples between the two signals to once again generate DC signals proportional to the phase offset of the original signals.

Figure 2:
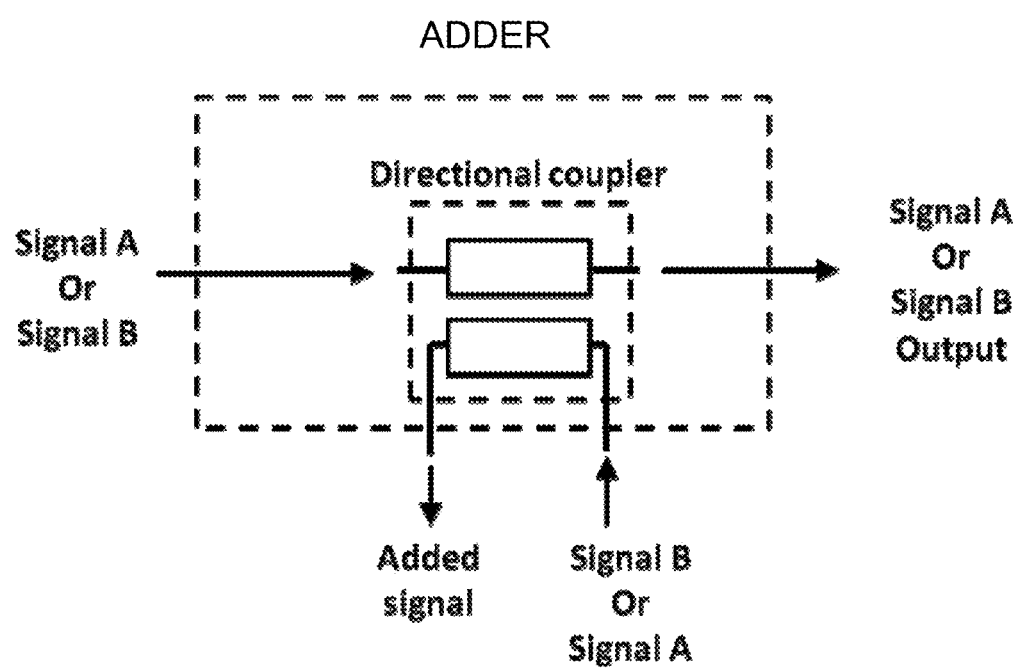
FIG. 2 is a diagram for an adder component with a directional coupler configured in accordance with one embodiment of the present invention.

There are multiple ways in which to realize the signal combiner or signal adder shown in FIG. 1. For example, FIG. 2 presents an adder comprising a directional coupler comprising a first signal A or signal B input, a second signal B or signal A input, an added signal output, and a signal A or signal B output. Such a configuration allows the adder to be inserted in series with one of the signals wherein a "pass-through" of the original signal is preserved to allow that signal to continue on to its original destination. An addition of two signals is therefore created with minimal disruption to that original physical layout of the signal lines.

Figure 3:
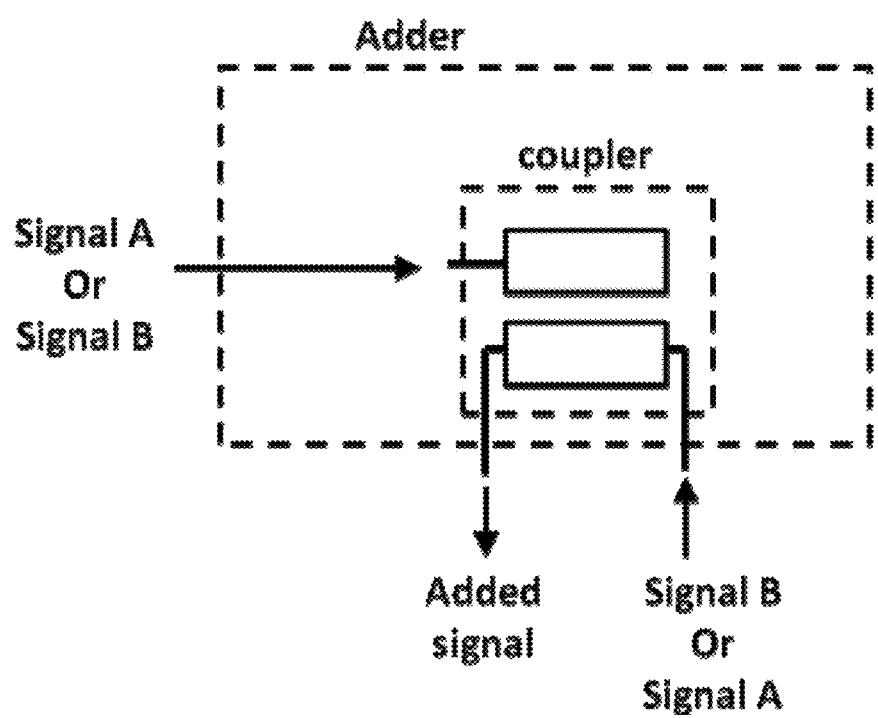
FIG. 3 is a diagram for an adder component with a coupler configured in accordance with one embodiment of the present invention.

FIG. 3 presents an adder comprising a coupler comprising a first Signal A or Signal B input and a second Signal A or Signal B input and an added signal output. Here, there is no "pass-through" of the original signal. Instead, a dedicated line is used to route the signal directly to the adder.

Figure 4:
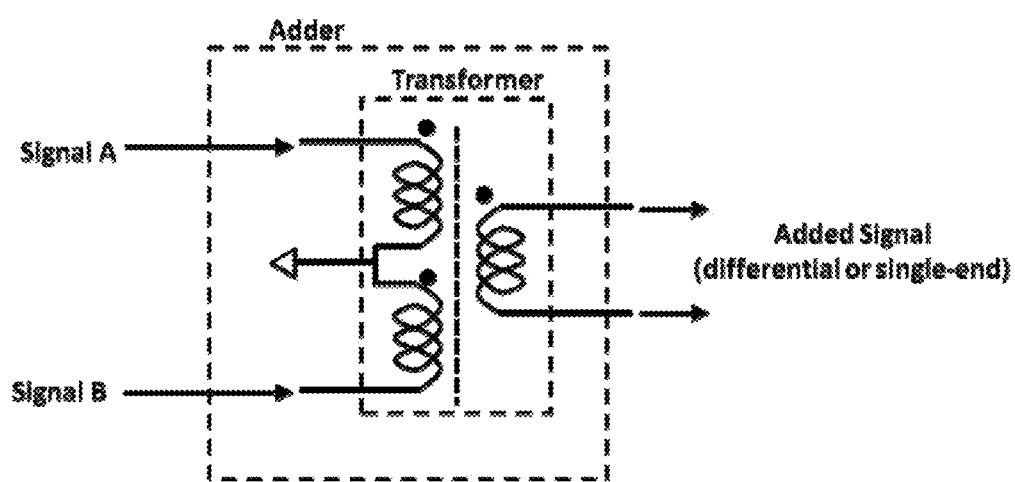
FIG. 4 is a diagram for an adder component with a transformer configured in accordance with one embodiment of the present invention.

FIG. 4 presents an adder comprising a transformer comprising a Signal A input and a Signal B input and added signal (differential or single-end) output.

Figure 5:
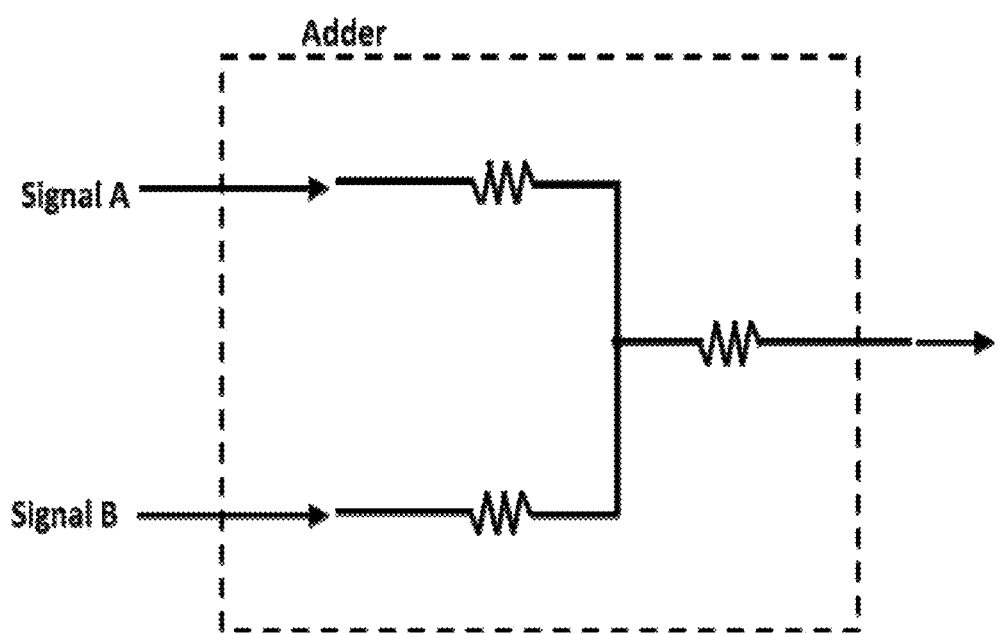
FIG. 5 is a diagram for an adder component configured in accordance with one embodiment of the present invention.

FIG. 5 presents a resistive adder comprising a Signal A input and a Signal B input and an added signal output. Transmission lines can be incorporated with any of the above adder structures.

Figure 6:
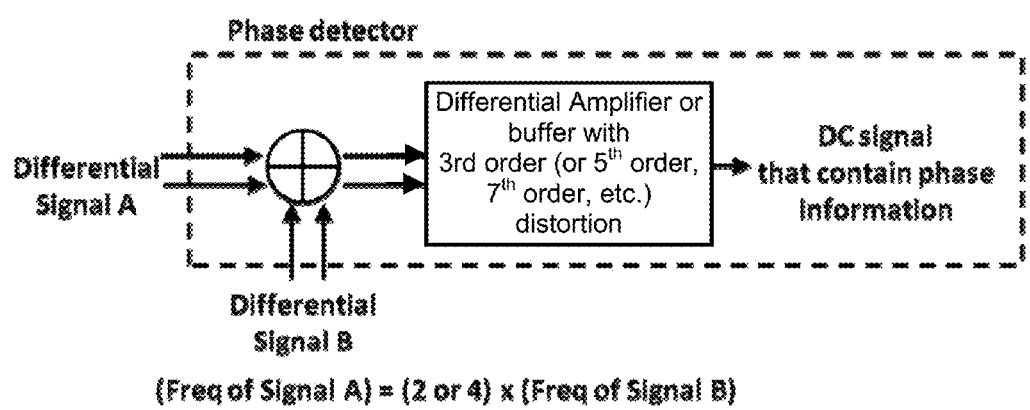
FIG. 6 is a diagram for a phase detector component configured in accordance with one embodiment of the present invention.

FIG. 6 presents a phase detector comprising a differential Signal A input and a differential Signal B input, that are combined and presented to a differential amplifier or buffer having odd-order distortion, outputting a DC signal that contains phase information. Here, the order of distortion used is represented as $(2k+1)$, where k is a positive integer. The frequency of Signal A should be an even multiple of the frequency of Signal B. Here, we represent this even multiple as 2N, where N is a positive integer. To generate a DC output which is proportional to the phase difference between the two input Signals, A and B requires that k and N be selected appropriately with respect to one another. For example, k=1 and N=1 results in DC output as does k=2 (fifth-order distortion) and N=2 (frequency of signal B is four times the frequency of signal A). One skilled in the art will recognize that there is a wide range of possibilities between k and N which will result in an output signal centered at DC and related to the phase offset between the original signals.

Since the output signal of interest should be centered at DC and related to the phase offset between the original signals, it is important that the distortion circuit itself does not generate unwanted DC signals, known as DC offset.

Figure 7:
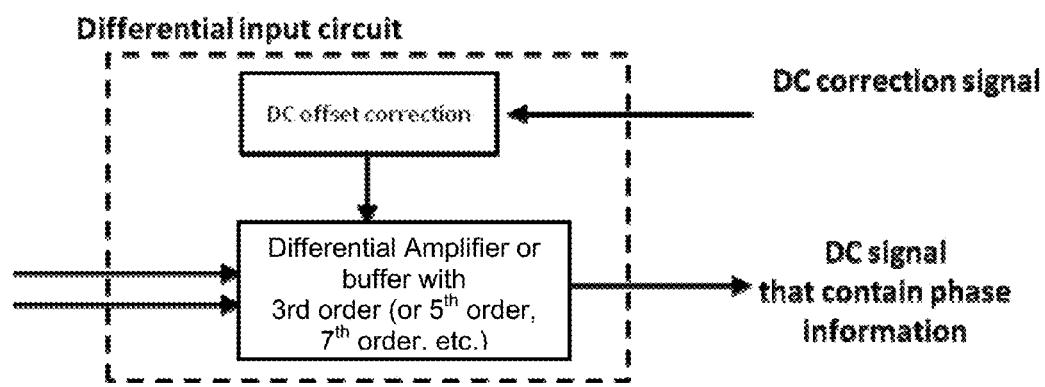
FIG. 7 is a diagram for a differential input circuit configured in accordance with one embodiment of the present invention.

FIG. 7 presents a differential input circuit comprising DC offset correction providing input to a differential amplifier or buffer with third and/or higher odd order distortion, and having inputs to the differential amplifier or buffer and DC correction signal input to the DC offset correction component, with output from the differential amplifier or buffer of a DC signal that contains phase information. By using the DC offset correction component, the unexpected DC output of the differential amplifier of buffer that doesn't contain the phase information is easily eliminated from the DC signal output.

Figure 8:
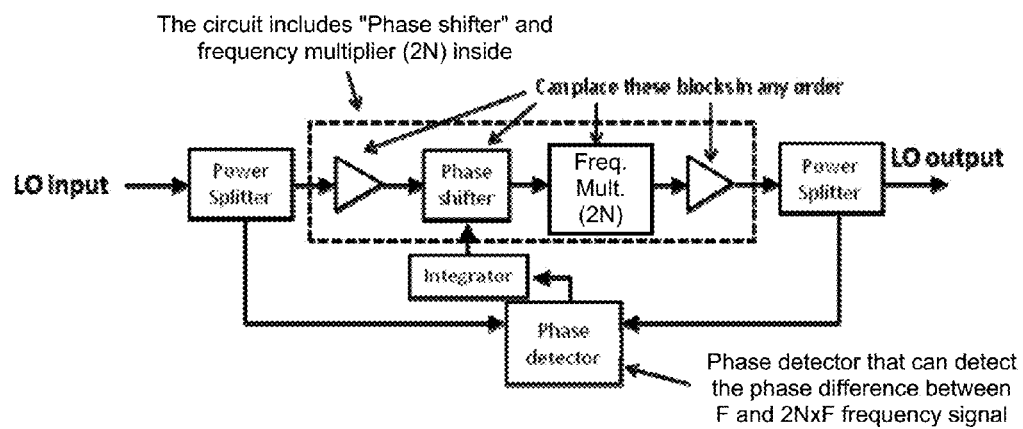
FIG. 8 is a diagram for a phase adjustment loop system including a frequency doubler configured in accordance with one embodiment of the present invention.

FIGS. 8 through 11 depict phase adjustment loop systems. FIG. 8 shows a phase adjustment circuit comprising a first signal splitter receiving local oscillator (LO) input signal, and distributing it among output A and output B; and a first phase shifting circuit, receiving output Signal A from the first signal splitter, and having a phase control signal port and a signal output port which is optionally amplified; a frequency multiplier which receives a signal from the phase shifting circuit and multiplies the frequency of that signal by multiple 2N; a second signal splitter receives an output signal from the frequency multiplier circuit and distributes it among LO output and output C; a phase detection circuit receives output Signal B from the first signal splitter and the output Signal C from the second signal splitter, the output signal is related to the phase difference between Signal B and Signal C; an integrator receives the signal from the phase detection circuit and outputs the integrated signal to the phase control port in first amplifier circuit. Note that order between the phase shifter, the optional amplifier, and the frequency multiplier can be exchanged. Although the integrator is used to realize the negative feedback loop in this case, for example it is also possible to use the ADC, DAC and digital integrator or digital processor instead of an analog integrator to realize the negative feedback loop or calibration.

Figure 9:
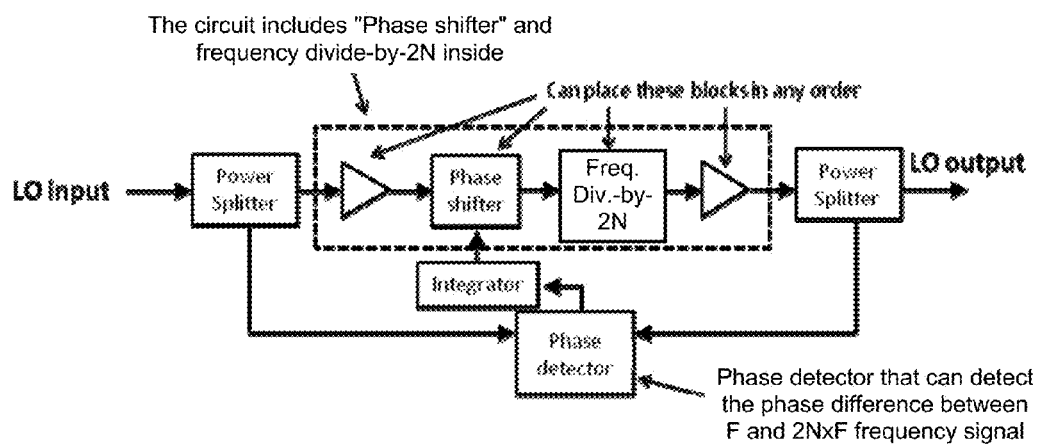
FIG. 9 is a diagram for a phase adjustment loop system including a frequency divider configured in accordance with one embodiment of the present invention.

FIG. 9 shows a phase adjustment circuit according to FIG. 8 wherein the frequency of LO output signal is divided by 2N with respect to the frequency of the LO input signal, and further comprising a first frequency divider in the first amplifier circuit, the first phase shifter and a first frequency divider which can be placed in any order.

Figure 10:
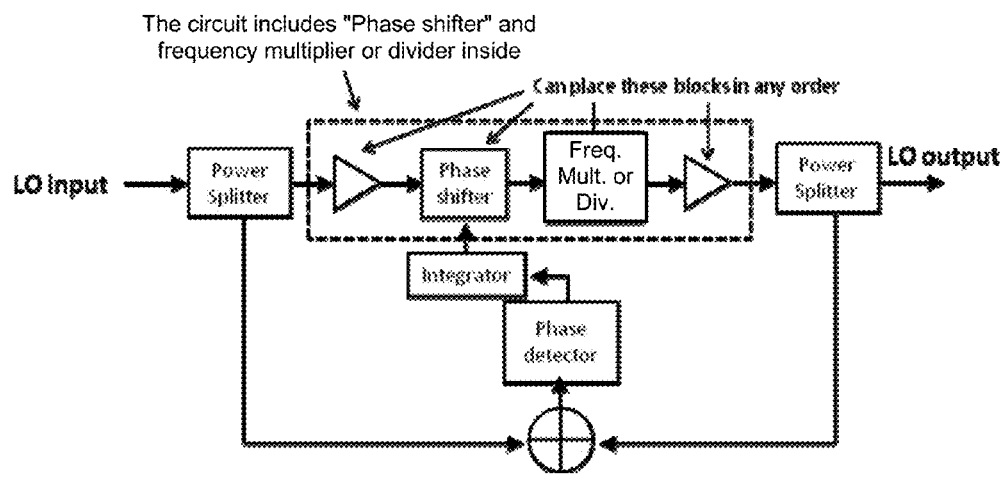
FIG. 10 is a diagram for a phase adjustment loop system including a power splitter configured in accordance with one embodiment of the present invention.

FIG. 10 shows a similar implementation to FIG. 8 or FIG. 9, except that the phase detector circuit has been expanded to explicitly show the power combiner used to combine the two signals, namely the LO input and the frequency-shifted (multiplied or divided) and phase-shifted LO signal.

Figure 11:
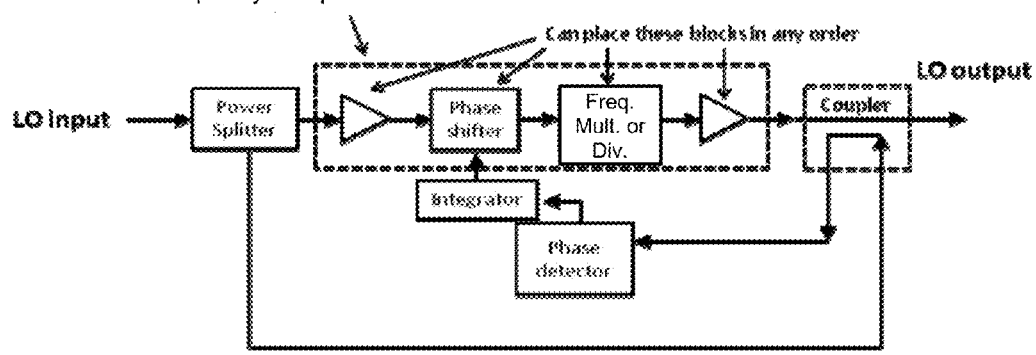
FIG. 11 is a diagram for a phase adjustment loop system including a coupler configured in accordance with one embodiment of the present invention.

Similarly, FIG. 11 shows an embodiment where the signal combiner is realized using a directional coupler to add the LO signal to the frequency-shifted (multiplied or divided) and phase-shifted LO signal.

Figure 12:
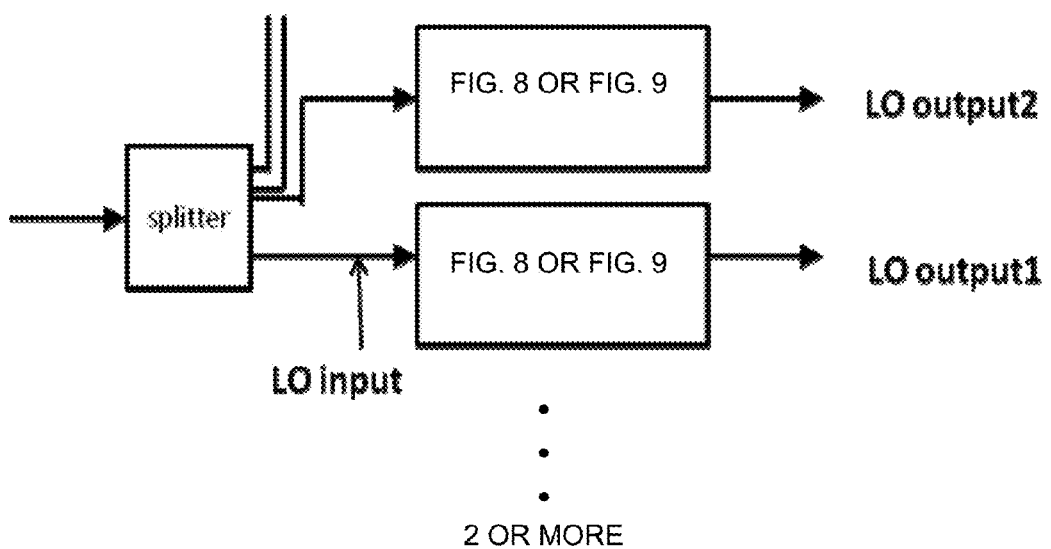
FIG. 12 is a diagram for a phase adjustment loop system including a splitter configured in accordance with one embodiment of the present invention.

FIG. 12 shows an embodiment wherein multiple phase adjustment loops can be used to control or calibrate the phase of multiple LO signals. Each phase adjustment loop or system can be implemented according to previous embodiments. A signal splitter can be used to create multiple LO inputs, one for each individual phase adjustment loop. The phase adjusted signals can then be used to provide calibrated LO signals for each individual receiver. FIG. 12 can include two or more FIG. 8 or FIG. 9 embodiments.

Figure 13:
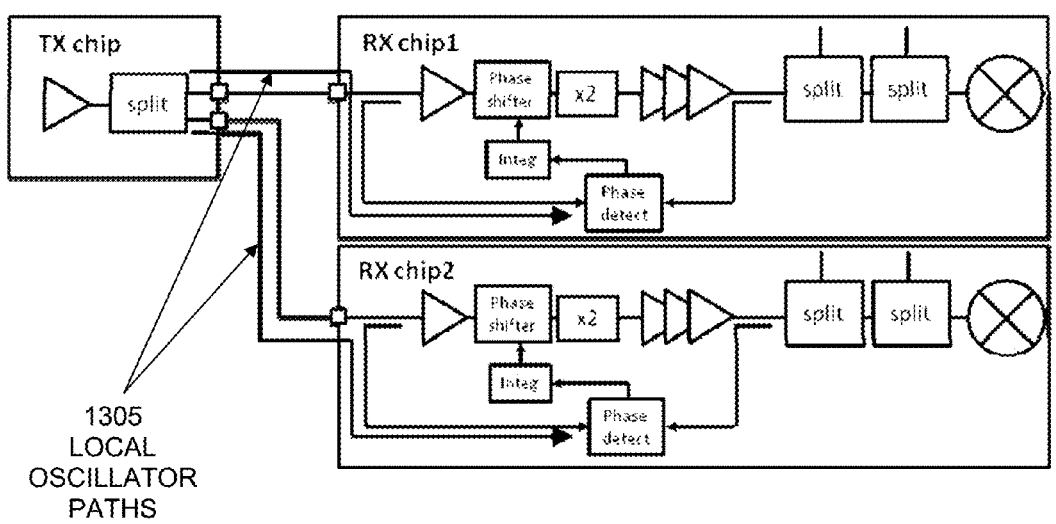
FIG. 13 is a diagram for a phase adjust PLL configured in accordance with one embodiment of the present invention.

FIG. 13 shows adjustable multiple receiver chips comprising a transmitter chip with output split to a receive chip 1 and a receive chip 2, each comprising a phase shifter, integrator, doubler or divider, phase detector, and splitters. Local oscillator line paths 1305 can all be comprised of passive circuitry, therefore the relative phase variation versus temperature can be quite small. The use of the phase adjustment system reduces the phase variation between the LO signals used for each receiver path.

Figure 14:
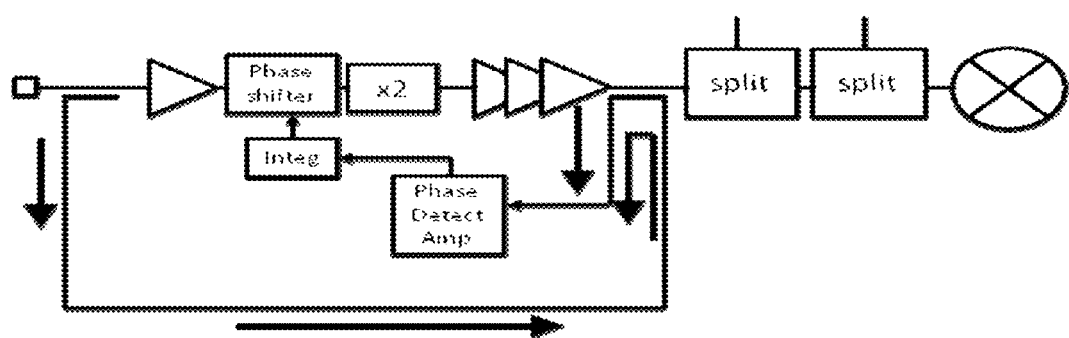
FIG. 14 is a diagram for a single phase adjust PLL configured in accordance with one embodiment of the present invention.

FIG. 14 shows additional details for a phase adjustment loop embedded within the receiver. A directional coupler is used at the input as a signal splitter. One portion of the input signal is fed to the phase-shifting and frequency-shifting chain whereas the other portion of the input signal is fed to a power combiner. This power combiner is also shown as a directional coupler which combines or adds the input LO signal to the phase-shifted and frequency-shifted LO signal. Here, frequency doubling is used within the phase adjustment loop; however frequency multiplication by 2N is also possible. Also, third order distortion created through an amplifier chain generates a DC signal related to the phase difference between the input LO signal and the phase-shifted and frequency-shifted LO signal.

Figure 15:
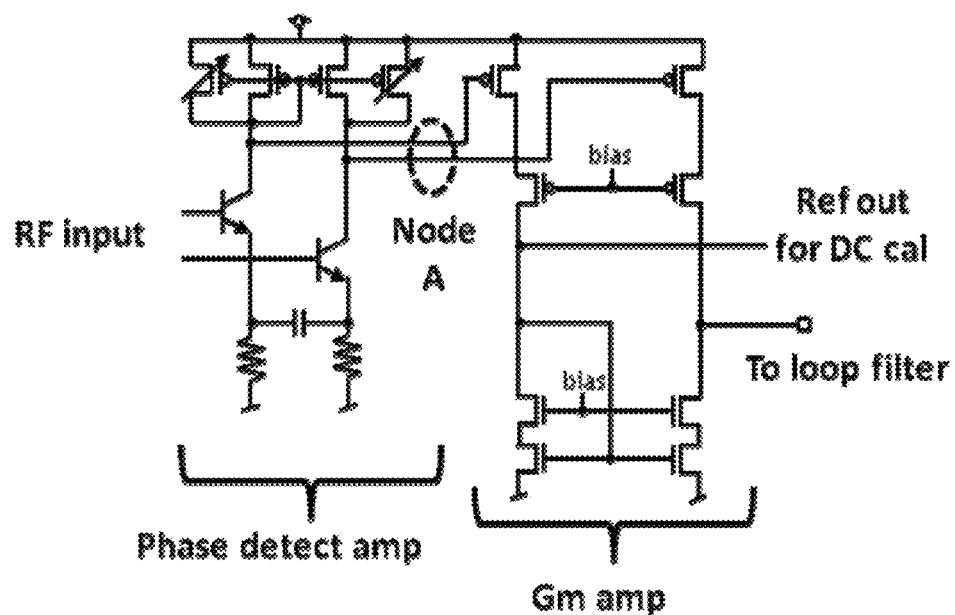
FIG. 15 is a diagram for a phase adjust PLL phase detector configured in accordance with one embodiment of the present invention.

FIG. 15 shows an embodiment of a phase detector comprising an RF amplifier which creates distortion and an output stage which amplifies the DC signal which results from that distortion. The output amplifier can also provide a signal used for DC offset correction.

Figure 16:
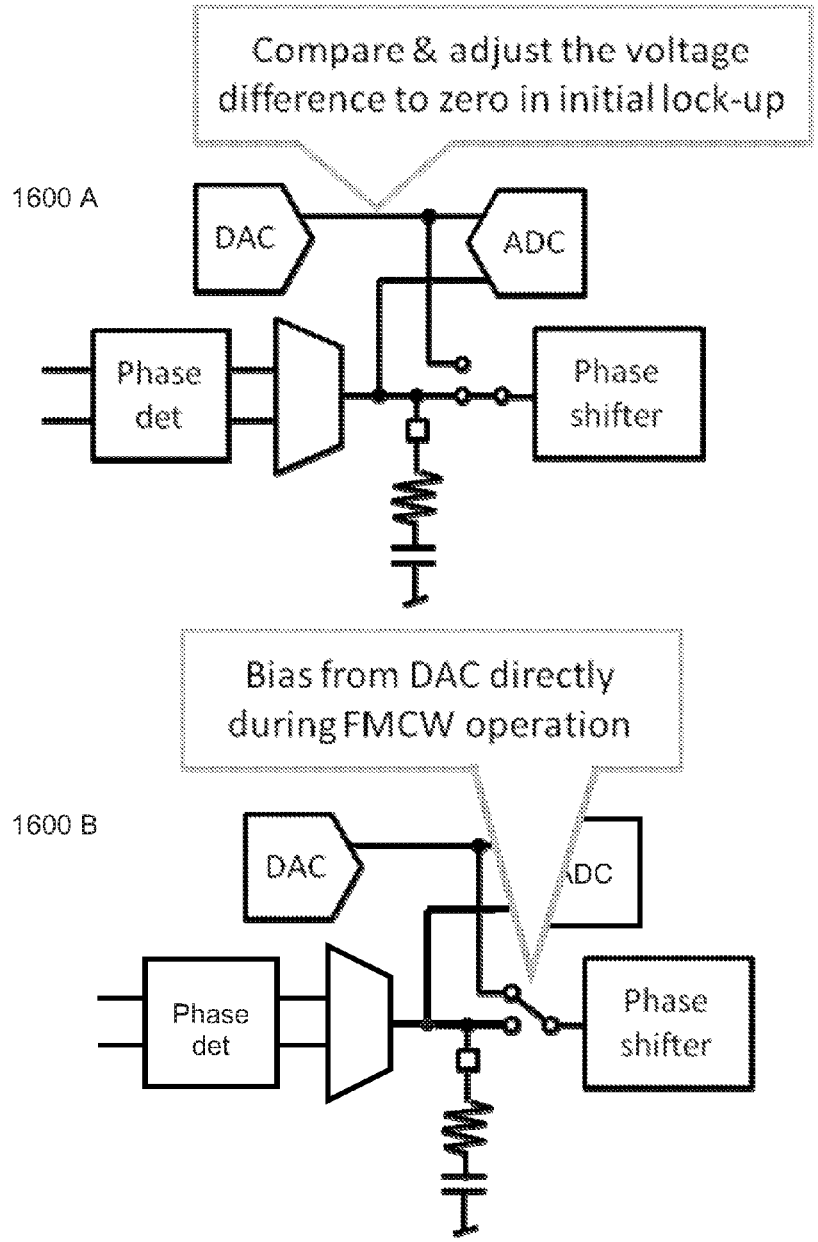
FIG. 16 is a diagram for a phase adjust PLL latch (hold) mode configured in accordance with one embodiment of the present invention.

FIG. 16 shows a digital to analog converter (DAC), analog to digital converter (ADC), a phase detector, a phase shifter, and a switch. Here, as shown in 1600A, the circuit can first be operated during an initial calibration phase wherein the control voltage for the phase shifter is obtained according to previous embodiments. This control voltage is then measured using the ADC. During FMCW operation, as shown in 1600B, the DAC can provide a constant control signal for the phase shifter, avoiding any unwanted transient affects for the control circuit during FMCW operation. As illustrated, the circuit performs a type of latching operation for the control signal.

Figure 17:
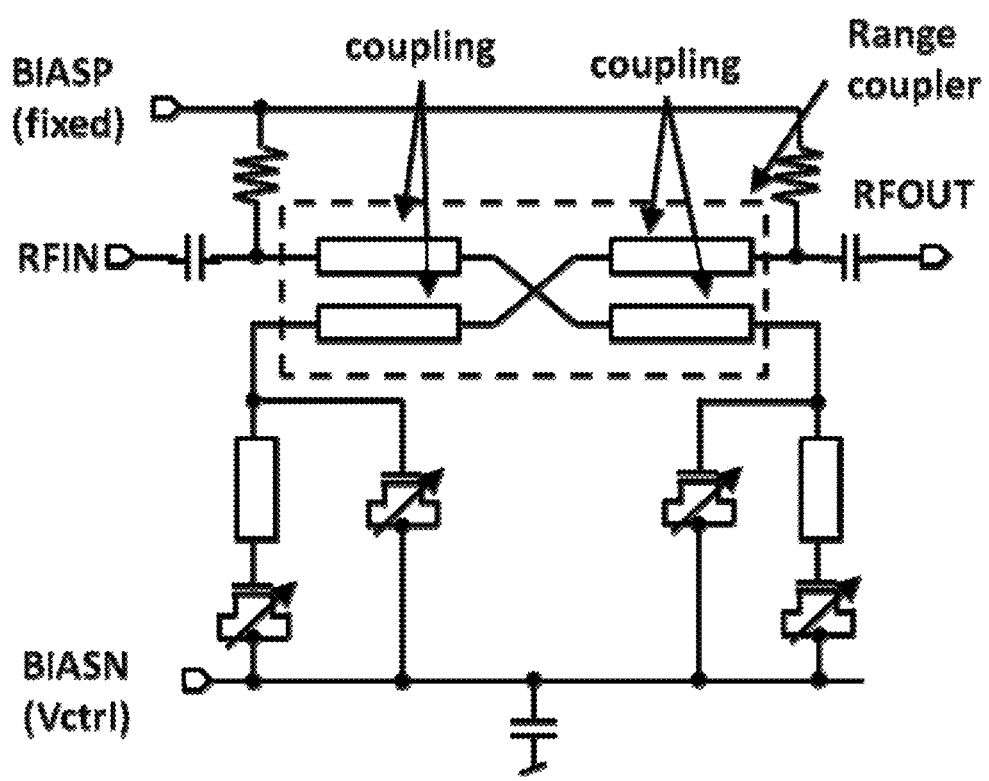
FIG. 17 is a schematic of a phase shifter configured in accordance with one embodiment of the present invention.

FIG. 17 shows a representative embodiment of a phase shifter. This phase shifter operates as a reflection type phase shifter, where phase shift is realized through controlling the impedance of the elements which terminate the coupled ports of the phase shifter. One skilled in the art will realize that a number of techniques can be used to realize a controllable phase shift at high frequencies.

Figure 18:
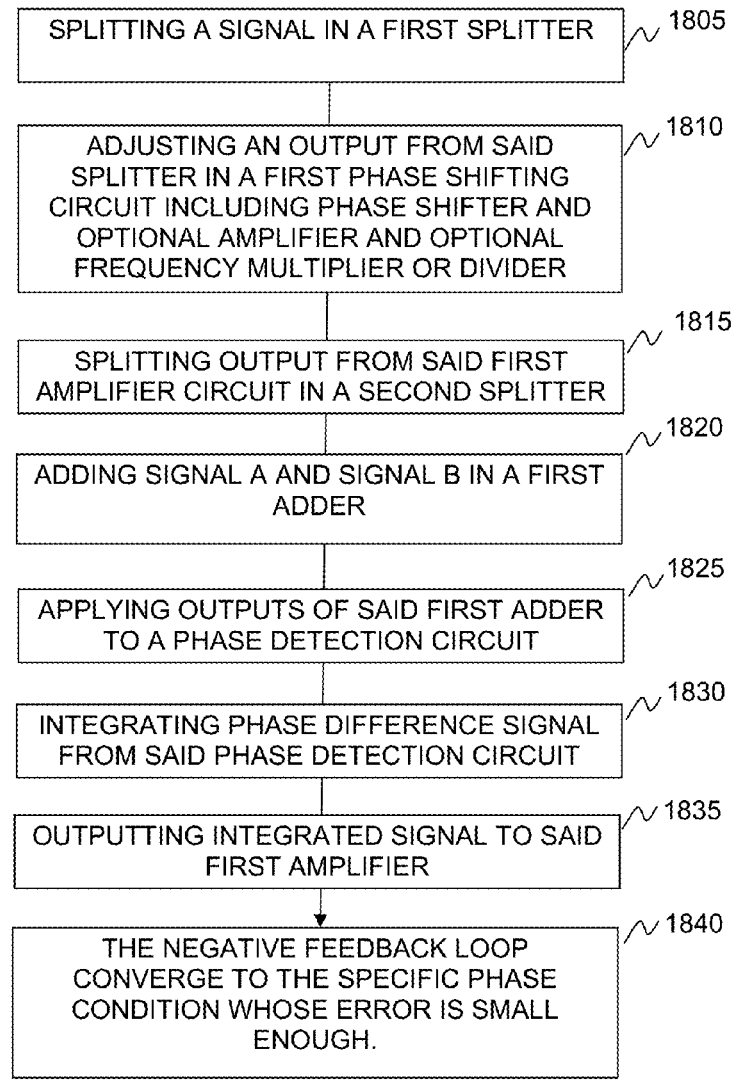
FIG. 18 is a flow chart for a method for adjusting multiple radar receiver chips to have very low phase offset between them configured in accordance with one embodiment of the present invention.

FIG. 18 is a flowchart 1800 of a method for multiple radar receiver chips to be adjusted to have very low phase offset between them. Steps comprise taking an input signal and splitting it 1805; adjusting an output from the splitter in a first phase shifting circuit including a phase shifter and optional amplifier and optional frequency multiplier or divider 1810; splitting output from the phase adjusted signal in a second splitter 1815; adding Signal A from first splitter and Signal B from second splitter in a first adder 1820; applying outputs of first adder to a phase detection circuit 1825; integrating phase difference signal from phase detection circuit 1830; outputting integrated signal to first amplifier 1835; negative feedback loop converges to the specific phase condition whose error is sufficiently small to result in a small steady-state error 1840.

Embodiments comprise taking an input signal and splitting it, where a portion is used to feed a phase shifting and frequency shifting path and a portion is used as a reference signal for a phase detection path; taking a portion of the input signal and both phase shifting and frequency shifting that signal, (where the frequency shift can involve multiplication and/or division) and where the order of operation between phase shifting and frequency shifting can be exchanged; (using optional amplifiers either before and/or after the phase-shifting) and frequency shifting path to increase the signal level; combining or adding the original LO signal with the phase-shifted and frequency-shifted signal; creating a (DC or) low frequency signal using a multi-frequency phase detection circuit which is related to the phase difference between the original LO signal and the phase-shifted and frequency-shifted signals and wherein the output signal is created through distortion within the phase detection circuit; filtering that DC or low frequency signal to provide a stable estimate of the resulting phase error; and using that filtered signal as the control signal for the phase shifting circuitry such that the overall phase adjustment system converges to a small steady-state error.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A phase calibration circuit device comprising:
    a first signal splitter receiving a local oscillator (LO) input signal, and outputting an output A and an output B;
    a first signal adjustment circuit comprising a first phase shifter, wherein said first signal adjustment circuit comprises a phase control signal port, a signal adjustment input signal port, and a signal adjustment output signal port;
    a second signal splitter receiving a first signal adjustment output signal from said first phase shifter, said second signal splitter comprising a LO output and an output C;
    a phase detection circuit receiving said output signal B from said first signal splitter and said output signal C from said second signal splitter, said phase detection circuit comprising a phase detection circuit output signal that is related to a phase difference between said signal B and said signal C; and
    a negative feedback loop wherein phase offset is reduced.

2. The device of claim 1 comprising a first amplifier circuit receiving said output signal A from said first signal splitter.

3. The device of claim 1 comprising a filter receiving said phase difference signal from said phase detection circuit, said filter outputting an filtered signal to said phase control signal port in said first phase shifting circuit, wherein said filter function is realized as an ADC/DAC combination and digital function to provide the filtering operation.

4. The device according to claim 1, wherein said first signal adjustment circuit includes a frequency multiplier wherein a frequency of an output signal of said first signal adjustment circuit is a multiple of a frequency of said input signal to said signal adjustment circuit and wherein said frequency multiplier can be placed either before or after said first phase shifter.

5. The device according to claim 1, wherein said signal adjustment circuit includes a frequency divider wherein a frequency of said input signal is a multiple of a frequency of an output signal to said signal adjustment circuit and wherein a frequency divider can be placed either before or after the phase shifter.

6. A phase detection circuit comprising:
    a first adder for receiving a signal A and a signal B, wherein one of said Signal A and said Signal B has a frequency which is a multiple of the other said signal; and
    a first distortion circuit that has a third order or higher odd-order distortion, said first distortion circuit receiving a first adder output signal from an output of a first adder, said first distortion circuit outputting a DC signal generated by said third or higher odd-order distortion and also related to a phase relationship between signal A and signal B.

7. The device of claim 6, wherein said first adder comprises:
    a directional coupler comprising:
    a first Signal A or first Signal B input;
    a second Signal B or Signal A input,
    an added signal output,
    a Signal A or Signal B output.

8. The device of claim 6, wherein said first adder comprises:
    a transformer comprising:
    a Signal A input;
    a Signal B input; and
    an added differential or single-end output signal.

9. The device of claim 6, wherein said first adder comprises:
    a Signal A input;
    a Signal B input;
    an output; and
    a resistive divider network between said Signal A input, Signal B input and output signal.

10. The device of claim 6 comprising a phase detector comprising:
    a differential Signal A input;
    a differential Signal B input, wherein said inputs are combined and presented to a differential amplifier or a buffer with third and/or fifth order distortion, said differential amplifier or buffer outputting a DC signal that contains phase information, wherein a frequency of said differential Signal A is a multiple of the frequency of said differential Signal B.

11. The device of claim 7 comprising a phase detector comprising:
    a differential Signal A input;
    a differential Signal B input, wherein said inputs are combined and presented to a differential amplifier or a buffer with third and/or fifth order distortion, said differential amplifier or buffer outputting a DC signal that contains phase information, wherein a frequency of said differential Signal A is a multiple of the frequency of said differential Signal B.

12. The device of claim 8 comprising a phase detector comprising:
    a differential Signal A input;
    a differential Signal B input, wherein said inputs are combined and presented to a differential amplifier or a buffer with third and/or fifth order distortion, said differential amplifier or buffer outputting a DC signal that contains phase information, wherein a frequency of said differential Signal A is a multiple of a frequency of said differential Signal B.

13. The device of claim 9 comprising a phase detector comprising:
    a differential Signal A input;
    a differential Signal B input, wherein said inputs are combined and presented to a differential amplifier or a buffer with third and/or fifth order distortion, said differential amplifier or buffer outputting a DC signal that contains phase information, wherein a frequency of said differential Signal A equals two or four times a frequency of said differential Signal B.

14. The device of claim 6 comprising a differential input circuit;
   said differential input circuit comprising:
   DC offset correction; and
   a differential amplifier or buffer creating third order or odd order distortion higher than three;
   wherein said DC offset correction of said differential input circuit provides input to said differential amplifier or buffer to eliminate an offset of said DC offset of said differential amplifier or buffer.

15. The device of claim 7 comprising a differential input circuit;
   said differential input circuit comprising:
   DC offset correction; and
   a differential amplifier or buffer creating third order or odd order distortion higher than three;
   wherein said DC offset correction of said differential input circuit provides input to said differential amplifier or buffer to eliminate an offset of said DC offset of said differential amplifier or buffer.

16. The device of claim 8 comprising a differential input circuit;
   said differential input circuit comprising:
   DC offset correction; and
   a differential amplifier or buffer creating third order or odd order distortion higher than three;
   wherein said DC offset correction of said differential input circuit provides input to said differential amplifier or buffer to eliminate an offset of said DC offset of said differential amplifier or buffer.

17. The device of claim 9 comprising a differential input circuit;
   said differential input circuit comprising:
   DC offset correction; and
   a differential amplifier or buffer creating third order or odd order distortion higher than three;
   wherein said DC offset correction of said differential input circuit provides input to said differential amplifier or buffer to eliminate an offset of said DC offset of said differential amplifier or buffer.

18. The device of claim 10 comprising a differential input circuit;
   said differential input circuit comprising:
   DC offset correction; and
   a differential amplifier or buffer creating third order or odd order distortion higher than three;
   wherein said DC offset correction of said differential input circuit provides input to said differential amplifier or buffer to eliminate an offset of said DC offset of said differential amplifier or buffer.

19. The device of claim 11 comprising a differential input circuit;
   said differential input circuit comprising:
   DC offset correction; and
   a differential amplifier or buffer creating third order or odd order distortion higher than three;
   wherein said DC offset correction of said differential input circuit provides input to said differential amplifier or buffer to eliminate an offset of said DC offset of said differential amplifier or buffer.

20. A phase calibration method for adjusting a plurality of frequency-modulated carrier-wave (FMCW) radar receiver chips to have reduced phase offset comprising:
   providing a circuit comprising a single local oscillator reference and built-in-test circuitry; said built-in-test circuitry comprising phase shifters, a multi-frequency nonlinear phase detection circuit, and power coupling circuits;
   splitting a signal in a first splitter;
   adjusting an output from said splitter in a first phase shifter;
   splitting output from a first amplifier circuit in a second splitter;
   adding a signal A and a signal B in a first adder;
   applying outputs of said first adder to a phase detection circuit;
   integrating phase difference signal from said phase detection circuit;
   outputting said integrated signal to said first amplifier; and
   converging in negative feedback loop whereby phase offset is reduced.

* * * * *